United States Patent
Arnold et al.

(10) Patent No.: US 8,581,678 B2
(45) Date of Patent: Nov. 12, 2013

(54) METHOD AND APPARATUS FOR ELECTROMAGNETIC ACTUATION

(75) Inventors: David Patrick Arnold, Gainesville, FL (US); Janhavi Shariniwas Agashe, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 875 days.

(21) Appl. No.: 12/373,778

(22) PCT Filed: Jul. 18, 2007

(86) PCT No.: PCT/US2007/073790
§ 371 (c)(1),
(2), (4) Date: Oct. 21, 2009

(87) PCT Pub. No.: WO2008/011466
PCT Pub. Date: Jan. 24, 2008

(65) Prior Publication Data
US 2010/0033278 A1 Feb. 11, 2010

Related U.S. Application Data

(60) Provisional application No. 60/832,358, filed on Jul. 19, 2006.

(51) Int. Cl.
*H01H 51/22* (2006.01)
(52) U.S. Cl.
USPC .............................................. 335/78; 200/181
(58) Field of Classification Search
USPC .............................................. 335/78; 200/181
See application file for complete search history.

(56) References Cited

U.S. PATENT DOCUMENTS 4,966,646 A * 10/1990 Zdeblick ........................... 216/2
5,834,864 A 11/1998 Hesterman et al.
(Continued)

FOREIGN PATENT DOCUMENTS

WO WO 03/050852 6/2003

OTHER PUBLICATIONS

Cheng, M.C., et al., "A silicon microspeaker for hearing instruments," *Journal of Micromechanics and Microengineering*, May 13, 2004, pp. 859-866, Issue 14.

(Continued)

*Primary Examiner* — Bernard Rojas
(74) *Attorney, Agent, or Firm* — Saliwanchik, Lloyd & Eisenschenk

(57) ABSTRACT

Embodiments of the subject invention relate to a method and apparatus for electromagnetic actuation. Embodiments of an electromagnet actuator in accordance with the subject invention can include a fixed main body and a deformable membrane or displaceable piston-like member. In the case of piston motion, in specific embodiments, the piston can be supported by a corrugated diaphragm or bellows. In various embodiments, all or portions of the electromagnet actuator can be produced using microfabrication techniques. Specific embodiment of the subject invention can incorporate a plurality of magnets providing magnetic flux to a plurality of coil conductor elements so as to provide a plurality of locations that a force is applied to the moveable body portion of the electromagnetic actuator. Specific embodiments can incorporate an array of magnets interdigitated with an array of coil conductor elements, where the arrays can include 2, 5, 10, 20, or more each. Further specific embodiments allow the relative position of the magnetic flux and coil conductor elements to remain substantially the same during the movement of the moveable body by positioning the magnets and coil conductor elements on the moveable body so that the relative position of the magnets and the coil conductor elements on the moveable body do not change with the movement of the moveable body.

89 Claims, 6 Drawing Sheets

(56) References Cited

U.S. PATENT DOCUMENTS

| | | | |
|---|---|---|---|
| 5,867,302 A * | 2/1999 | Fleming | 359/291 |
| 5,872,496 A | 2/1999 | Asada et al. | |
| 6,377,155 B1 | 4/2002 | Allen et al. | |
| 6,538,799 B2 * | 3/2003 | McClelland et al. | 359/291 |
| 6,635,837 B2 * | 10/2003 | Subramanian et al. | 200/181 |
| 6,735,008 B2 * | 5/2004 | Brophy et al. | 359/245 |
| 7,102,472 B1 * | 9/2006 | Nathanson et al. | 335/78 |
| 2001/0045530 A1 | 11/2001 | Haeberle et al. | |
| 2002/0050744 A1 | 5/2002 | Bernstein et al. | |
| 2003/0179058 A1 * | 9/2003 | Vaitkus et al. | 335/78 |
| 2004/0070816 A1 | 4/2004 | Kato et al. | |
| 2005/0030438 A1 | 2/2005 | Nishioka | |
| 2006/0145792 A1 * | 7/2006 | Hsu et al. | 335/78 |

OTHER PUBLICATIONS

Hwang, G.Y., et al., "Performance comparison between inner and outer permanent magnet type microspeakers used for mobile phones," *Journal of Applied Physics*, May 15, 2003, pp. 8519-8521, vol. 93, No. 10.

Hwang, G.Y., et al., "Analysis of a dynamic speaker in mobile phones by considering mechanical, electrical, and magnetic coupling effects," *Journal of Applied Physics*, May 15, 2002, pp. 6979-6981, vol. 91, No. 10.

Hwang, S.M., et al., "New Development of Combined Permanent-Magnet Type Microspeakers Used for Cellular Phones," *IEEE Transactions on Magnetics*, May 2005, pp. 2000-2003, vol. 41, No. 5.

Hwang, S.M., et al., "New Development of Integrated Microspeaker and Dynamic Receiver Used for Cellular Phones," *IEEE Transactions on Magnetics*, Sep. 2003, pp. 3259-3261, vol. 39, No. 5.

Rehder, J., et al., "Balanced membrane micromachined loudspeaker for hearing instrument application," *Journal of Micromechanics and Microengineering*, Jan. 5, 2001, pp. 334-338, Issue 11.

* cited by examiner

METHOD AND APPARATUS FOR ELECTROMAGNETIC ACTUATION

CROSS-REFERENCE TO RELATED APPLICATIONS

The present application is the U.S. National Stage Application of International Patent Application No. PCT/US2007/073790, filed on Jul. 18, 2007, which claims the benefit of U.S. Provisional Application Ser. No. 60/832,358, filed Jul. 19, 2006, both of which are hereby incorporated by reference herein in their entirety, including any figures, tables, or drawings.

BACKGROUND OF INVENTION

Embodiments of the subject invention relate to a microscale electromagnetic actuator or transducer. Embodiments of the subject invention operate by electrodynamic actuation. Electrodynamic transduction is the principle by which a conventional audio speaker operates. The transduction is governed by Lorentz forces acting on the moving charges in a wire conductor. The Lorentz equation states that a magnetic force occurs when electrical current flows perpendicular to a magnetic field. This force has a magnitude proportional to the current, I, and the magnetic field, B, and acts in a direction perpendicular to both the field and the current. In practical implementation, electrodynamic actuators often offer higher stroke, higher power density, and better response at low operating frequencies (~1 Hz-20 kHz) compared to other actuation schemes, e.g., piezoelectric, electrostatic, magnetostrictive, and electrothermal. These performance metrics are important for switches, relays, pumps, valves, flow-control actuators, speakers, and other microscale device applications.

BRIEF SUMMARY

Embodiments of the subject invention relate to a method and apparatus for electromagnetic actuation. Embodiments of an electromagnet actuator in accordance with the subject invention can include a fixed main body and a deformable membrane or displaceable piston-like member. In the case of piston motion, in specific embodiments, the piston can be supported by a corrugated diaphragm or bellows. In various embodiments, all or portions of the electromagnet actuator can be produced using microfabrication techniques.

Specific embodiments of the subject invention can be built using microfabrication techniques, such as, for example, silicon etching, and electroplating. Such microfabrication techniques typically involve chemical and/or physical processes that progress layer by layer on a substantially planar surface. Microfabricated devices, in accordance with embodiments of the invention, can provide the potential for low-cost batch fabrication. Embodiments of the subject invention incorporating the electrodynamic approach can provide one or more of the following: lower voltages; higher efficiency, and higher power density, compared to alternatives using electrostatic and/or piezoelectric actuation.

Specific embodiment of the subject invention can incorporate a plurality of magnets providing magnetic flux to a plurality of coil conductor elements so as to provide a plurality of locations that a force is applied to the moveable body portion of the electromagnetic actuator. Specific embodiments can incorporate an array of magnets interdigitated with an array of coil conductor elements, where the arrays can include, for example, 2, 5, 10, 20, 50, 100, 200, or more each. Specific embodiments allow the magnetic flux applied to the coil conductor elements to remain substantially the same during the movement of the moveable body even when the magnets are positioned on the fixed body and the coil conductor elements are positioned on the moveable body or the magnets are positioned on the moveable body and the coil conductors are positioned on the main, or fixed, body. Further specific embodiments allow the relative position of the magnetic flux and coil conductor elements to remain substantially the same during the movement of the moveable body by positioning the magnets and coil conductor elements on the moveable body so that the relative position of the magnets and the coil conductor elements on the moveable body do not change with the movement of the moveable body.

DETAILED DISCLOSURE

Embodiments of the subject invention relate to a method and apparatus for electromagnetic actuation. Embodiments of an electromagnet actuator in accordance with the subject invention can include a fixed main body and a deformable membrane or displaceable piston-like member. In the case of piston motion, in specific embodiments, the piston can be supported by a corrugated diaphragm or bellows. In various embodiments, all or portions of the electromagnet actuator can be produced using microfabrication techniques.

In a specific embodiment, the entire structure can be produced using microfabrication techniques. Such microfabrication techniques can include, but are not limited to, silicon wafer etching, metal electroplating, spin-coating of polymers, photolithography, and thin film deposition approaches such as evaporation, sputtering, and chemical vapor deposition.

Specific embodiment of the subject invention can incorporate a plurality of magnets providing magnetic flux to a plurality of coil conductor elements so as to provide a plurality of locations that a force is applied to the moveable body portion of the electromagnetic actuator. Specific embodiments, having a force applied to the moveable body at a plurality of locations, can allow the force applied to the moveable body to be applied evenly across the moveable body. Specific embodiments can incorporate an array of magnets interdigitated with an array of coil conductor elements, where the arrays can include 2, 5, 10, 20, or more each. Specific embodiments allow the magnetic flux applied to the coil conductor elements to remain substantially the same during the movement of the moveable body even when the magnets are positioned on the fixed body and the coil conductor elements are positioned on the moveable body or the magnets are positioned on the moveable body and the coil conductors are positioned on the main, or fixed, body. Further specific embodiments allow the relative position of the magnetic flux and coil conductor elements to remain substantially the same during the movement of the moveable body by positioning the magnets and coil conductor elements on the moveable body so that the relative position of the magnets and the coil conductor elements on the moveable body do not change with the movement of the moveable body.

Figure 1:
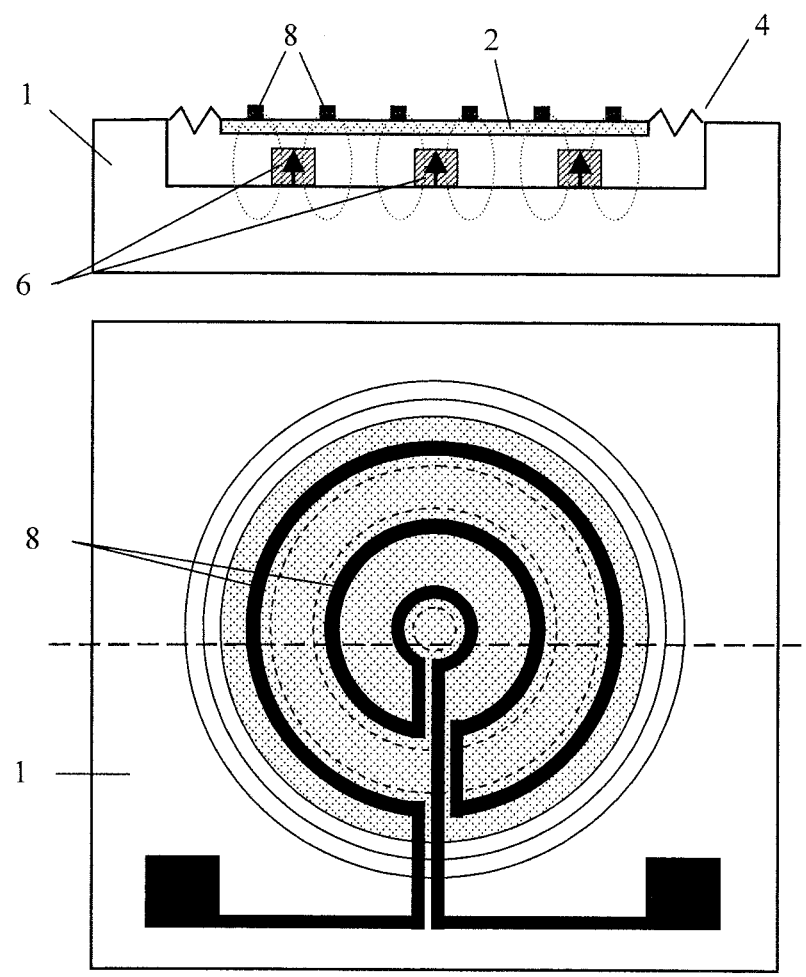
FIG. 1 shows a cross-sectional view and a top view of an embodiment of the subject invention incorporating permanent magnets positioned on the fixed body and a coil positioned on the moveable body.

In a specific embodiment, actuation and displacement of the moveable body occur by the magnetic forces that act on electrical conductors that are affixed to the movable body membrane. In alternative embodiments, actuation and displacement of the moveable body occur by the magnetic forces that act on magnets located on the moveable body. The moveable body can be, but is not limited to, a rigid piston or a flexible membrane. With respect to the embodiment shown in FIG. 1, the magnets providing the magnetic fields reside on the non-moveable, or fixed, body. Referring to FIG. 1, the magnets sit beneath the piston and are magnetized out-of-plane. The magnets size and shape are selected to provide magnetic fields that are radially-directed in the surface of the coils. When current passes through the spiral-like coil, the resulting force causes an out-of-plane deflection of the piston. In a specific embodiment, magnetically soft materials (not shown) can be integrated into the device to, for example, form a magnetic yoke in order to increase the magnetic field strength to which the coil is exposed.

A specific embodiment of the device shown in FIG. 1 is a silicon substrate, or fixed body 1, and has a centerplate, or moveable body 2, suspended over a cavity by an edge-diaphragm 4, which may be corrugated. Rings of permanent magnets 6 are recessed in the cavity, and a spiral-like winding 8 resides on the moveable plate. The magnets and winding are designed such that radially-directed magnetic fields act on the winding conductors 8. When current passes through the winding, Lorentz forces ($dF_z = B_r \times J_\theta$) act on the conductor segments causing the centerplate to displace against the restoring force of the edge diaphragm. A time-varying waveform results in time-varying plate displacements.

In a specific embodiment, the structure of FIG. 1 can be fabricated by etching the cavity, patterning the micromagnets inside, and then filling the cavity with a sacrificial material. The plate, edge diaphragm, and conductors can then be micromachined onto the surface, and the sacrificial cavity fill etched to release the plate. Alternatively, wafer-bonding approaches can be employed. The frequency response of the actuator can be tailored through appropriate dimensional and material selections for the device.

Figure 2:
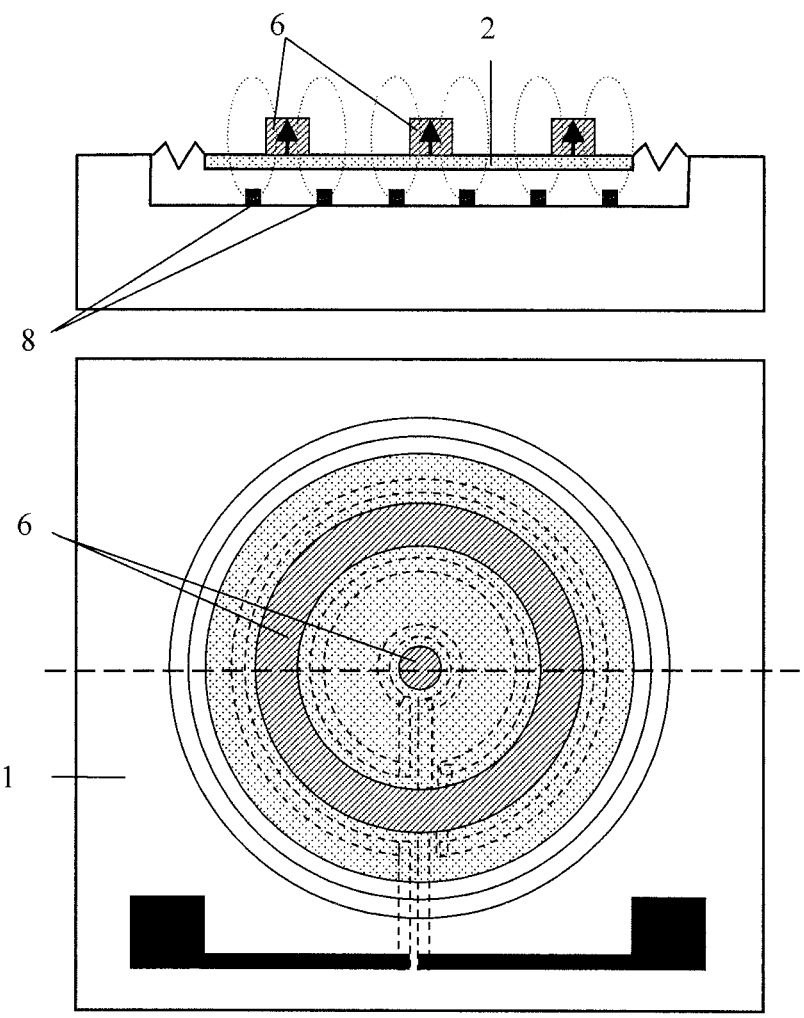
FIG. 2 shows a cross-sectional view and a top view of an embodiment of the subject invention incorporating permanent magnets positioned on the moveable body and a coil located on the fixed body.
Figure 6:
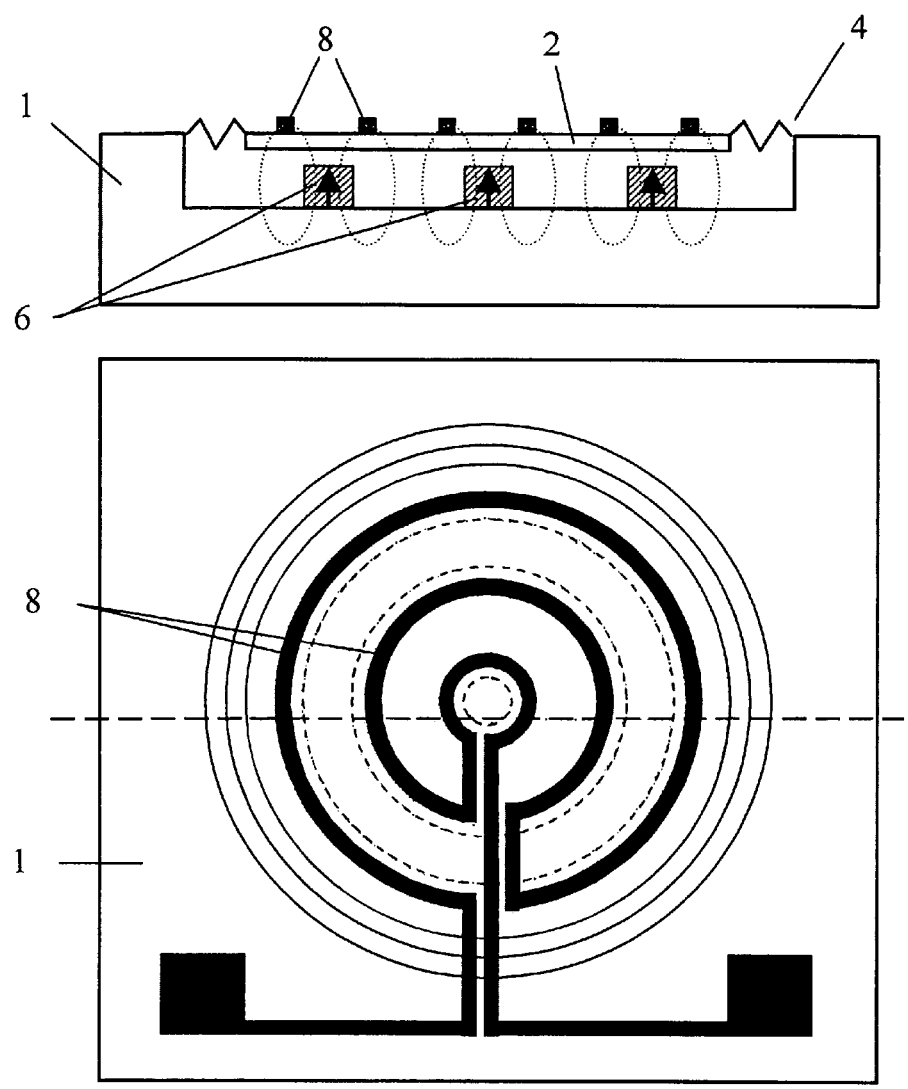
FIG. 6 shows an embodiment similar to the embodiment shown in FIG. 1, incorporating a deformable membrane.

FIG. 2 shows an embodiment, similar to the embodiment shown in FIG. 1 with respect to the origin of the forces, where the permanent magnets 6 are positioned on the moveable body 2 and the coil 8 is positioned on the fixed body 1. Fabrication of this embodiment can be similar to the fabrication of the embodiment of FIG. 1 described above. For illustration purposes, the embodiments shown in FIGS. 1 and 2 include two permanent magnets 6 and three coil conductor elements 8. Additional embodiments can incorporate more permanent magnets and more coil conductor elements. Such arrays of permanent magnets and coil conductor elements can create more magnetic circuits for coil elements to be located in. Specific embodiments can have up to 5, up to 10, up to 20, or more permanent magnets in the array and corresponding coil elements. Additional embodiments can also have different configurations. FIG. 6 shows an embodiment similar to the embodiment of FIG. 1 where the moveable body 2 is a deformable membrane.

Figure 3:
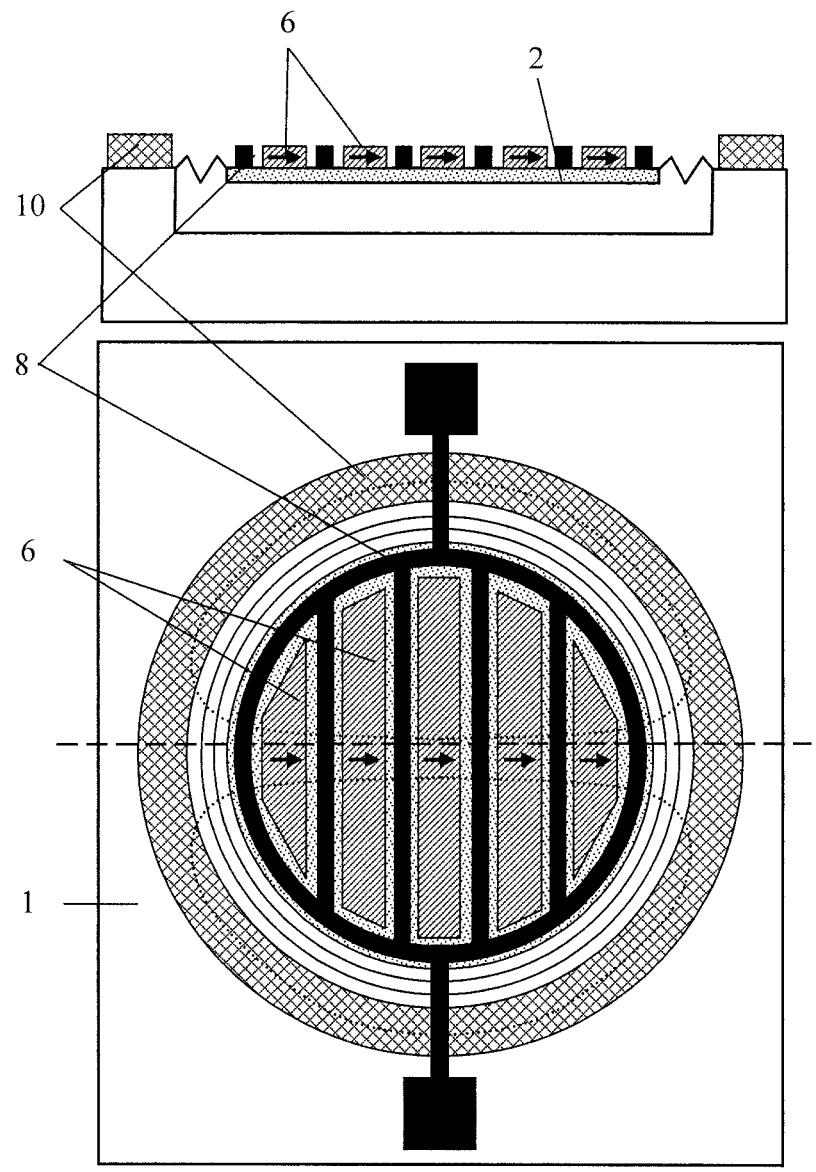
FIG. 3 shows a cross-sectional view and a top view of an embodiment of the subject invention incorporating permanent magnets positioned on the moveable body, a coil on the moveable body, and a soft magnet yoke on the fixed body.

Referring to FIG. 3, the magnets 6 and the coil 8 are attached to the movable body membrane. In this embodiment, the magnetic fields act primarily in-plane. A soft-magnetic material 10 can form a yoke that surrounds the structure to help close the magnetic circuit and provide mechanical force linkage to the substrate 1. Referring to the top view of FIG. 3, the magnetic flux going to the right in the figure leaves the farthest right permanent magnet on the moveable body 2 and enters the yoke 10 and fixed body 1. The magnetic flux then goes either up or down in the figure and travels to the left and then enters the farthest left permanent magnet 6 on the moveable body. This embodiment may be simpler to fabricate than the embodiments in FIGS. 1 and 2 because the coils and magnets reside on the same layer. In addition, the magnetic fields "sensed" by the coils do not change substantially, if at all, with displacement of the moveable body, which may lead to a more linear response. The more linear response is due to the driving force being nearly constant with displacement. The additional mass of magnets attached to the piston may result in slower response and lower bandwidth of operation.

Figure 4:
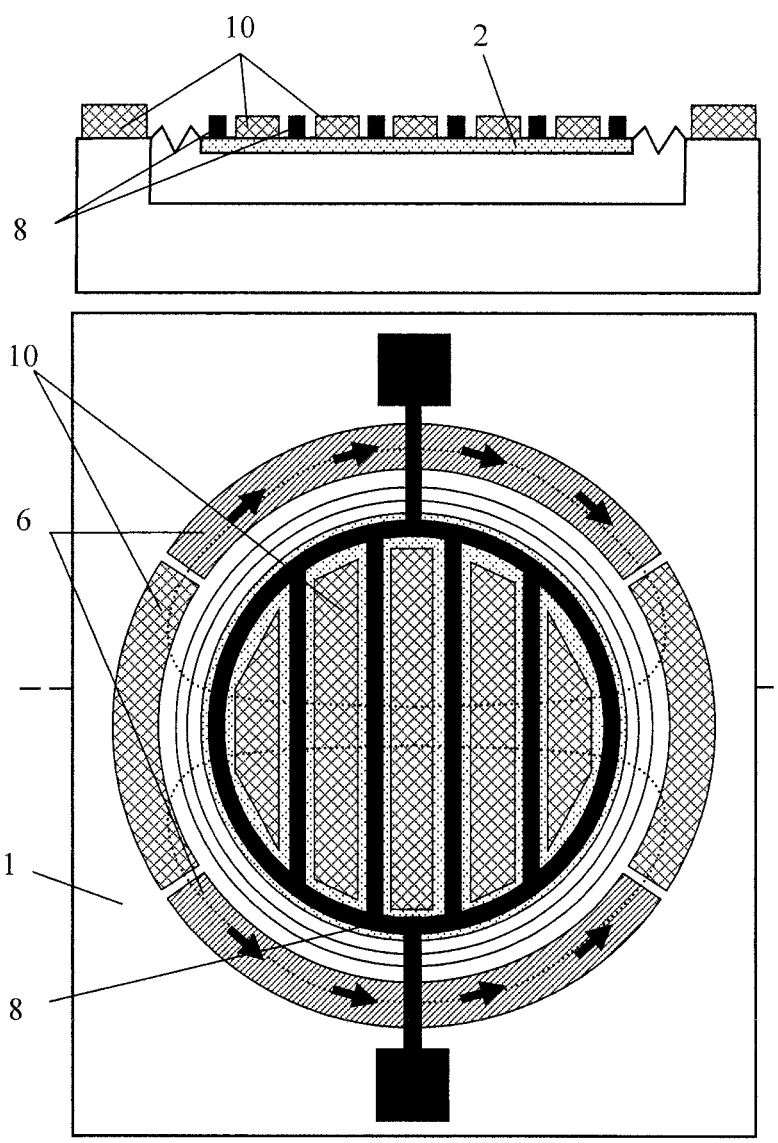
FIG. 4 shows a cross-sectional view and a top view of an embodiment of the subject invention incorporating permanent magnets positioned on the fixed body, soft magnets on the moveable body and on the fixed body, and a coil on the moveable body.

FIG. 4 shows another embodiment of the subject invention that operates similarly to FIG. 3, but uses magnets 6 in different locations. In FIG. 4, the embodiment shows coil conductor elements 8 positioned on the moveable body 2, soft magnets 10 positioned on the moveable body 2, soft magnets 10 positioned on a fixed body 1, and permanent magnets 6 positioned on the fixed body 1. The soft magnets 10 guide the magnetic flux from the permanent magnets 6 so as to expose the coil conductor elements 8 to properly oriented magnetic flux. Referring to the top view in FIG. 4, the magnetic flux leaves the permanent magnets, positioned on the fixed body, to the right, is directed to the left through the soft magnets positioned on the moveable body, and then is directed back into the permanent magnets from the left. In this embodiment, the soft magnets can be used to enhance and guide the magnetic fields across the coil elements. In an alternative, one or more of the soft magnetics can be removed or replaced with appropriately magnetized permanent magnets.

The embodiments shown in FIGS. 3 and 4 have six coil conductor elements located in magnetic fields produced from multiple permanent magnets and, optimal, soft magnets. Additional embodiments can have larger numbers in the array of coil elements and can have different configurations.

Figure 5A:
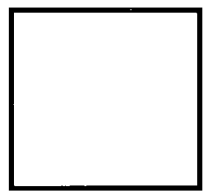
FIGS. 5A-5E show various shapes that a moveable body can have in accordance with embodiments of the subject invention.
Figure 5B:
Figure 5C:
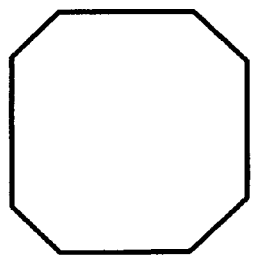
Figure 5D:
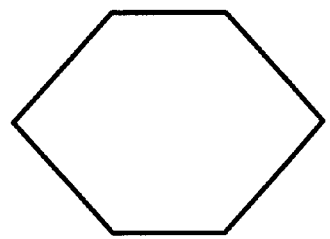
Figure 5E:
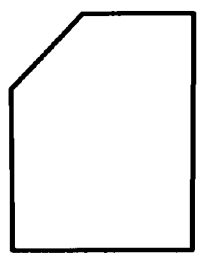

The dimensions of embodiments of the subject device can be tailored to meet design criteria, such as, but not limited to, stroke, bandwidth, and power consumption for various applications. Specific embodiments have a moveable body thickness less than 1 mm and diameter less than 1.5 cm. Further embodiments have a moveable body diameter less than 1 cm, less than 5 mm, less than 1 mm, less than 500 µm, and less than 100 µm. The embodiments illustrated have circular shaped moveable bodies, viewed from the top, but other moveable body shapes can be utilized. Such shapes include, but are not limited to, square (FIG. 5A), rectangular (FIG. 5B), polygonal (FIG. 5C), hexagonal (FIG. 5D), and irregular shaped (FIG. 5E). Embodiments can have moveable bodies having various shapes, where specific embodiments have moveable bodies having sizes, such as length, width, and height, in one dimension are less than 1.5 cm, less than 1 cm, less than 5 mm, less than 1 mm, less than 500 µm, and less than 100 µm, and in further embodiments have moveable bodies having sizes in two dimensions less than 1.5 cm, less than 1 cm, less than 5 mm, less than 1 mm, less than 500 µm, and less than 100 µm. Embodiments can also incorporate coil conductor elements and/or permanent magnets having sizes, such as length, width, and height, in one dimension less than 1 mm, less than 500 µm, and less than 100 µm, and further embodiments can incorporate coil conductor elements and/or permanent magnets having sizes such as length, width, and height, in two dimensions less than 1 mm, less than 500 µm, and less than 100 µm. Embodiments of the subject device can achieve large actuation forces with high stroke. Embodiments of the subject device can be used in various microactuators, such as, but not limited to, speakers, synthetic jets; pumps, valves, linear motors, microspeaker, flow-control actuators, and microvalves.

Magnetically, soft materials that can be used in conjunction with the subject invention include, but are not limited to, magnetically soft ferromagnetic materials with high permeability and magnetic saturation, such as NiFe and CoFe alloys. Magnetically hard, or permanent magnet, materials that can be utilized with the subject invention include, but are not limited to, alloys of CoNiP, FePt, CoPt, SmCo, and NdFeB. In specific embodiments, the magnets can be patterned into the device and then magnetized. In specific embodiments, such magnets can have thicknesses ranging from 1-500 µm.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. An electromagnetic actuator, comprising:
   a main body;
   a moveable body, where the moveable body is moveably attached to the main body;
   a plurality of coil conductor elements, wherein the plurality of coil conductor elements are microfabricated; and
   a plurality of permanent magnets providing magnetic flux to the plurality of coil conductor elements, wherein the plurality of permanent magnets are microfabricated,
   wherein when a current is applied to one or more of the plurality of coil conductor elements a force moves the moveable body in a piston motion with respect to the main body.

2. The electromagnetic actuator according to claim 1, wherein the movable body is a deformable membrane.

3. The electromagnetic actuator according to claim 1, wherein the movable body is a displaceable piston.

4. The electromagnetic actuator according to claim 3, wherein the piston is moveably attached to the main body by a diaphragm.

5. The electromagnetic actuator according to claim 4, wherein the diaphragm is corrugated.

6. The electromagnetic actuator according to claim 4, wherein when the moveable body moves with respect to the main body, the diaphragm provides a restoring force to move the moveable body back to an equilibrium position with respect to the main body.

7. The electromagnetic actuator according to claim 1, wherein the moveable body has a circular shape.

8. The electromagnetic actuator according to claim 7, wherein the moveable body has a diameter less than 1.5 cm.

9. The electromagnetic actuator according to claim 7, wherein the moveable body has a diameter less than 1 cm.

10. The electromagnetic actuator according to claim 7, wherein the moveable body has a diameter less than 5 mm.

11. The electromagnetic actuator according to claim 7, wherein the moveable body has a thickness less than 1 mm.

12. The electromagnetic actuator according to claim 1, wherein the moveable body has a shape selected from the following group: square, rectangular, polygonal, hexagonal, and irregular.

13. The electromagnetic actuator according to claim 1, wherein the size of one or more of the plurality of coil conductor elements is less than 1 mm in one dimension.

14. The electromagnetic actuator according to claim 1, wherein the size of one or more of the plurality of coil conductor elements is less than 500 µm in one dimension.

15. The electromagnetic actuator according to claim 1, wherein the size of one or more of the plurality of coil conductor elements is less than 100 µm in one dimension.

16. The electromagnetic actuator according to claim 1, wherein the size of one or more of the plurality of coil conductor elements is less than 1 mm in two dimensions.

17. The electromagnetic actuator according to claim 1, wherein the size of one or more of the plurality of coil conductor elements is less than 500 µm in two dimensions.

18. The electromagnetic actuator according to claim 1, wherein the size of one or more of the plurality of coil conductor elements is less than 100 µm in two dimensions.

19. The electromagnetic actuator according to claim 1, wherein the size of one or more of the plurality of permanent magnets is less than 1 mm in one dimension.

20. The electromagnetic actuator according to claim 1, wherein the size of one or more of the plurality of permanent magnets is less than 500 µm in one dimension.

21. The electromagnetic actuator according to claim 1, wherein the size of one or more of the plurality of permanent magnets is less than 100 µm in one dimension.

22. The electromagnetic actuator according to claim 1, wherein the size of one or more of the plurality of permanent magnets is less than 1 mm in two dimensions.

23. The electromagnetic actuator according to claim 1, wherein the size of one or more of the plurality of permanent magnets is less than 500 µm in two dimensions.

24. The electromagnetic actuator according to claim 1, wherein the size of one or more of the plurality of permanent magnets is less than 100 µm in two dimensions.

25. The electromagnetic actuator according to claim 1, wherein the plurality of coil conductor elements comprises an array of coil conductor elements and the plurality of permanent magnets comprises an array of permanent magnets.

26. The electromagnetic actuator according to claim 25, wherein the array of permanent magnets is interdigitated with the array of coil conductor elements.

27. The electromagnetic actuator according to claim 1, wherein the force that moves the moveable body with respect to the main body is applied evenly across the moveable body.

28. The electromagnetic actuator according to claim 1, wherein the relative position of the magnetic flux from the plurality of coil conductor elements remains substantially the same during movement of the moveable body with respect to the main body.

29. The electromagnetic actuator according to claim 1, wherein the plurality of permanent magnets are positioned on the main body and the plurality of coil conductor elements are positioned on the moveable body, wherein when a current is applied to the plurality of coil conductor elements, a Lorentz force on the plurality of coil conductor elements moves the moveable body with respect to the main body.

30. The electromagnetic actuator according to claim 29, wherein the plurality of permanent magnets are positioned on the main body such that the magnetic flux provided to the plurality of coil conductor elements is substantially parallel to a surface of the moveable body upon which the plurality of coil configuration elements are positioned.

31. The electromagnetic actuator according to claim 30, further comprising:
magnetically soft material positioned on the moveable body, wherein the magnetically soft material positioned on the moveable body increases the magnetic field strength, due to the plurality of permanent magnets, to which at least one of the plurality of coil conductor elements is exposed.

32. The electromagnetic actuator according to claim 31, further comprising:
additional magnetically soft material positioned on the main body, wherein the additional magnetically soft material positioned on the main body increases the magnetic field strength, due to the plurality of permanent magnets, to which at least one of the plurality of coil conductor elements is exposed.

33. The electromagnetic actuator according to claim 29, further comprising:
one or more additional permanent magnets positioned on the moveable body, wherein the one or more additional permanent magnets are positioned on the moveable body so as to increase the magnetic field strength to which the plurality of coil conductor elements is exposed.

34. The electromagnetic actuator according to claim 1, wherein the plurality of coil conductor elements are positioned on the main body and the plurality of permanent magnets are positioned on the moveable body, wherein when a current is applied to the plurality of coil conductor elements, a magnetic force on the plurality of permanent magnets moves the moveable body with respect to the main body.

35. The electromagnetic actuator according to claim 34, wherein the plurality of permanent magnets are positioned on the moveable body such that the magnetic flux provided to the plurality of coil conductor elements is substantially parallel to a surface of the moveable body upon which the plurality of permanent magnets are positioned.

36. The electromagnetic actuator according to claim 34, wherein the plurality of coil conductor elements form one or more coil, wherein the plurality of magnets are positioned with respect to the one or more coil such that the plurality of permanent magnets are magnetized out of plane with respect to the one or more coil, wherein the piston motion is out of plane with respect to the one or more coil.

37. The electromagnetic actuator according to claim 1, further comprising:
magnetically soft material integrated with the electromagnetic actuator so as to increase the magnetic field strength, due to the plurality of permanent magnets, to which at least one of the plurality of coil conductor elements is exposed.

38. The electromagnetic actuator according to claim 1, wherein the plurality of coil conductor elements form a spiral coil.

39. The electromagnetic actuator according to claim 1, wherein the plurality of coil conductor elements are positioned on the moveable body, wherein the plurality of permanent magnets are positioned on the moveable body, further comprising a soft-magnetic material positioned on the main body so as to increase the magnetic field strength, due to the plurality of permanent magnets, to which at least one of the plurality of coil conductor elements is exposed, wherein when a current is applied to the plurality of coil conductor elements, a Lorentz force on the plurality of coil conductor elements moves the moveable body with respect to the main body.

40. The electromagnetic actuator according to claim 1, wherein the electromagnetic actuator is incorporated into one of the following: a speaker, a synthetic jet, a valve, a linear motor, a microspeaker, a flow-control actuator, a micropump, or a microvalve.

41. The electromagnetic actuator according to claim 1, wherein the plurality of coil conductor elements are positioned on the main body or the moveable body, wherein the plurality of permanent magnets are positioned on the main body or the moveable body.

42. The electromagnetic actuator according to claim 1, wherein the plurality of permanent magnets comprises at least 20 permanent magnets.

43. The electromagnetic actuator according to claim 1, wherein the plurality of permanent magnets comprises at least 200 permanent magnets.

44. The electromagnetic actuator according to claim 1, wherein the current has a time-varying waveform, wherein the piston motion is time-varying.

45. A method of producing an electromagnetic actuator, comprising:
producing an electromagnetic actuator comprising:
a main body;
a moveable body, where the moveable body is moveably attached to the main body;
a plurality of coil conductor elements, wherein the plurality of coil conductor elements are microfabricated, wherein the plurality of coil conductor elements are positioned on the main body or the moveable body; and
a plurality of permanent magnets providing magnetic flux to the plurality of coil conductor elements, wherein the plurality of permanent magnets are microfabricated, wherein the plurality of permanent magnets are positioned on the main body or the moveable body,
wherein when a current is applied to one or more of the plurality of coil conductor elements a force moves the moveable body in a piston motion with respect to the main body, wherein the electromagnetic actuator is produced via microfabrication techniques.

46. A method of electromagnetic actuation, comprising:
providing an electromagnetic actuator comprising:
a main body;
a moveable body, where the moveable body is moveably attached to the main body;
a plurality of coil conductor elements, wherein the plurality of coil conductor elements are microfabricated; and
a plurality of permanent magnets providing magnetic flux to the plurality of coil conductor elements, wherein the plurality of permanent magnets are microfabricated,
wherein when a current is applied to one or more of the plurality of coil conductor elements a force moves the moveable body in a piston motion with respect to the main body; and
applying a current to one or more of the plurality of coil conductor elements.

47. The method according to claim 46, wherein the movable body is a deformable membrane.

48. The method according to claim 46, wherein the movable body is a displaceable piston.

49. The method according to claim 48, wherein the piston is moveably attached to the main body by a diaphragm.

50. The method according to claim 49, wherein the diaphragm is corrugated.

51. The method according to claim 49, wherein when the moveable body moves with respect to the main body, the diaphragm provides a restoring force to move the moveable body back to an equilibrium position with respect to the main body.

52. The method according to claim 46, wherein the moveable body has a circular shape.

53. The method according to claim 52, wherein the moveable body has a diameter less than 1.5 cm.

54. The method according to claim 52, wherein the moveable body has a diameter less than 1 cm.

55. The method according to claim 52, wherein the moveable body has a diameter less than 5 mm.

56. The method according to claim 52, wherein the moveable body has a thickness less than 1 mm.

57. The method according to claim 46, wherein the moveable body has a shape selected from the following group: square, rectangular, polygonal, hexagonal, and irregular.

58. The method according to claim 46, wherein the size of one or more of the plurality of coil conductor elements is less than 1 mm in one dimension.

59. The method according to claim 46, wherein the size of one or more of the plurality of coil conductor elements is less than 500 μm in one dimension.

60. The method according to claim 46, wherein the size of one or more of the plurality of coil conductor elements is less than 100 μm in one dimension.

61. The method according to claim 46, wherein the size of one or more of the plurality of coil conductor elements is less than 1 mm in two dimensions.

62. The method according to claim 46, wherein the size of one or more of the plurality of coil conductor elements is less than 500 μm in two dimensions.

63. The method according to claim 46, wherein the size of one or more of the plurality of coil conductor elements is less than 100 μm in two dimensions.

64. The method according to claim 46, wherein the size of one or more of the plurality of permanent magnets is less than 1 mm in one dimension.

65. The method according to claim 46, wherein the size of one or more of the plurality of permanent magnets is less than 500 μm in one dimension.

66. The method according to claim 46, wherein the size of one or more of the plurality of permanent magnets is less than 100 μm in one dimension.

67. The method according to claim 46, wherein the size of one or more of the plurality of permanent magnets is less than 1 mm in two dimensions.

68. The method according to claim 46, wherein the size of one or more of the plurality of permanent magnets is less than 500 μm in two dimensions.

69. The method according to claim 46, wherein the size of one or more of the plurality of permanent magnets is less than 100 μm in two dimensions.

70. The method according to claim 46, wherein the plurality of coil conductor elements comprises an array of coil conductor elements and the plurality of permanent magnets comprises an array of permanent magnets.

71. The method according to claim 70, wherein the array of permanent magnets is interdigitated with the array of coil conductor elements.

72. The method according to claim 46, wherein the force that moves the moveable body with respect to the main body is applied evenly across the moveable body.

73. The method according to claim 46, wherein the relative position of the magnetic flux from the plurality of coil conductor elements remains substantially the same during movement of the moveable body with respect to the main body.

74. The method according to claim 46, wherein the plurality of permanent magnets are positioned on the main body and the plurality of coil conductor elements are positioned on the moveable body, wherein when a current is applied to the plurality of coil conductor elements, a Lorentz force on the plurality of coil conductor elements moves the moveable body with respect to the main body.

75. The method according to claim 74, wherein the plurality of permanent magnets are positioned on the main body such that the magnetic flux provided to the plurality of coil conductor elements is substantially parallel to a surface of the moveable body upon which the plurality of coil configuration elements are positioned.

76. The method according to claim 75, further comprising:
magnetically soft material positioned on the moveable body, wherein the magnetically soft material positioned on the moveable body increases the magnetic field strength, due to the plurality of permanent magnets, to which at least one of the plurality of coil conductor elements is exposed.

77. The method according to claim 76, further comprising:
additional magnetically soft material positioned on the main body, wherein the additional magnetically soft material positioned on the main body increases the magnetic field strength, due to the plurality of permanent magnets, to which at least one of the plurality of coil conductor elements is exposed.

78. The method according to claim 74, further comprising:
one or more additional permanent magnets positioned on the moveable body, wherein the one or more additional permanent magnets are positioned on the moveable body so as to increase the magnetic field strength to which the plurality of coil conductor elements is exposed.

79. The method according to claim 46, wherein the plurality of coil conductor elements are positioned on the main body and the plurality of permanent magnets are positioned on the moveable body, wherein when a current is applied to the plurality of coil conductor elements, a magnetic force on the plurality of permanent magnets moves the moveable body with respect to the main body.

80. The method according to claim 79, wherein the plurality of permanent magnets are positioned on the moveable body such that the magnetic flux provided to the plurality of coil conductor elements is substantially parallel to a surface of the moveable body upon which the plurality of permanent magnets are positioned.

81. The method according to claim 46, further comprising:
magnetically soft material integrated with the electromagnetic actuator so as to increase the magnetic field strength, due to the plurality of permanent magnets, to which at least one of the plurality of coil conductor elements is exposed.

82. The method according to claim 46, wherein the plurality of coil conductor elements form a spiral coil.

83. The method according to claim 46,
wherein the plurality of coil conductor elements are positioned on the moveable body, wherein the plurality of permanent magnets are positioned on the moveable body, further comprising a soft-magnetic material positioned on the main body so as to increase the magnetic field strength, due to the plurality of permanent magnets, to which at least one of the plurality of coil conductor elements is exposed, wherein when a current is applied to the plurality of coil conductor elements, a Lorentz force on the plurality of coil conductor elements moves the moveable body with respect to the main body.

84. The method according to claim 46,
wherein the electromagnetic actuator is incorporated into one of the following: a speaker, a synthetic jet, a valve, a linear motor, a microspeaker, a flow-control actuator, a micropump, or a microvalve.

85. The method according to claim 46,
wherein the plurality of coil conductor elements are positioned on the main body or the moveable body,
wherein the plurality of permanent magnets are positioned on the main body or the moveable body.

86. The method of electromagnetic actuation according to claim 46, wherein the plurality of permanent magnets comprises at least 20 permanent magnets.

87. The method of electromagnetic actuation according to claim 46, wherein the plurality of permanent magnets comprises at least 200 permanent magnets.

88. The method of electromagnetic actuation according to claim 46,
wherein the current has a time-varying waveform, wherein the piston motion is time-varying.

89. The method of electromagnetic actuation according to claim 46, wherein the plurality of coil conductor elements form one or more coil, wherein the plurality of magnets are positioned with respect to the one or more coil such that the plurality of permanent magnets are magnetized out of plane with respect to the one or more coil, wherein the piston motion is out of plane with respect to the one or more coil.

* * * * *